(12) United States Patent
Van Schothorst et al.

(10) Patent No.: US 7,612,867 B2
(45) Date of Patent: Nov. 3, 2009

(54) LITHOGRAPHIC APPARATUS

(75) Inventors: Gerard Van Schothorst, Hedel (NL); Fransiscus Hendrikus Van Deuren, Valkenswaard (NL); Jan Van Eijk, Eindhoven (NL); Erik Roelof Loopstra, Heeze (NL); Robert-Han Munnig Schmidt, Hapert (NL); Felix Godfried Peter Peeters, Lieshout (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 12/222,483

(22) Filed: Aug. 11, 2008

(65) Prior Publication Data
US 2009/0002676 A1    Jan. 1, 2009

Related U.S. Application Data

(62) Division of application No. 10/848,586, filed on May 19, 2004, now Pat. No. 7,423,730.

(30) Foreign Application Priority Data

May 28, 2003    (EP)    ................................. 03076644

(51) Int. Cl.
G03B 27/54    (2006.01)
G03B 27/72    (2006.01)
(52) U.S. Cl. .......................................... 355/67; 355/71
(58) Field of Classification Search .................. 355/53, 355/67, 71; 430/5, 20, 22, 30
See application file for complete search history.

(56) References Cited

U.S. PATENT DOCUMENTS

| 4,589,769 | A  | 5/1986 | Matsuki |
| 5,295,017 | A  | 3/1994 | Brown |
| 5,638,211 | A  | 6/1997 | Shiraishi |
| 5,712,698 | A  | 1/1998 | Poschenrieder et al. |
| 5,760,881 | A  | 6/1998 | Miyazaki et al. |
| 5,780,861 | A  | 7/1998 | Apelgren et al. |
| 6,078,381 | A  | 6/2000 | Suzuki |
| 6,200,709 | B1 | 3/2001 | Nuytkens et al. |

(Continued)

FOREIGN PATENT DOCUMENTS

EP    1 061 561 A1    12/2000

(Continued)

OTHER PUBLICATIONS

Office Action in Japanese Patent Application No. 2004-157062, dated Jun. 15, 2007.

(Continued)

*Primary Examiner*—Peter B Kim
(74) *Attorney, Agent, or Firm*—PIllsbury Winthrop Shaw Pittman LLP

(57) ABSTRACT

A lithographic apparatus including means for selectively transmitting a projection beam before imaging the patterned projection beam onto a substrate. The means may include any of the following: a selectively transmitting device disposed downstream of a patterning device in the direction of the projection beam, a fixed and a moving set of masking blades in a scanning system or an array of switchable elements. The means may be provided to a mask table/holder or to a frame or structure of the lithographic projection apparatus.

17 Claims, 10 Drawing Sheets

U.S. PATENT DOCUMENTS

| | | |
|---|---|---|
| 6,204,911 B1 | 3/2001 | Kurosawa et al. |
| 6,307,619 B1 | 10/2001 | Galburt et al. |
| 6,359,678 B1 | 3/2002 | Ota |
| 6,555,274 B1 | 4/2003 | Kye et al. |
| 6,600,166 B2 | 7/2003 | Sato et al. |
| 6,661,498 B1 | 12/2003 | Hirukawa |
| 6,721,033 B1 | 4/2004 | Kaneko |
| 2001/0024269 A1 | 9/2001 | Koide et al. |
| 2002/0014600 A1 | 2/2002 | Sato et al. |
| 2002/0043321 A1 | 4/2002 | Shida et al. |
| 2002/0045113 A1 | 4/2002 | Pril et al. |
| 2002/0131030 A1 | 9/2002 | Ouchi |
| 2002/0154284 A1 | 10/2002 | Sato |
| 2002/0176065 A1 | 11/2002 | Pierrat |
| 2003/0020893 A1 | 1/2003 | Kawashima |
| 2003/0031017 A1 | 2/2003 | Tsuji |

FOREIGN PATENT DOCUMENTS

| | | |
|---|---|---|
| JP | 62-92959 | 4/1987 |
| JP | 64-71123 | 3/1989 |
| JP | 1-091419 | 4/1989 |
| JP | 3-011613 | 1/1991 |
| JP | 3-085543 | 4/1991 |
| JP | 3-222319 | 10/1991 |
| JP | 6-077112 | 3/1994 |
| JP | 8-055795 | 2/1996 |
| JP | 10-209017 | 8/1998 |
| JP | 10-209032 | 8/1998 |
| JP | 10-284371 | 10/1998 |
| JP | 2001-217178 | 8/2001 |
| JP | 2002-043214 | 2/2002 |
| JP | 2003-045784 | 2/2003 |

OTHER PUBLICATIONS

European Search Report dated Mar. 3, 2004.

LITHOGRAPHIC APPARATUS

PRIORITY INFORMATION

The present application is a divisional of U.S. patent application Ser. No. 10/848,586 filed on May 19, 2004 now U.S. Pat. No. 7,423,730 in which benefit is claimed under 35 U.S.C. § 121. This application also claims priority under 35 U.S.C. § 119(a) from European Patent Application No. 03016644.8 filed May 28, 2003. The entire contents of each of the foregoing applications are herein fully incorporated by reference.

BACKGROUND OF THE INVENTION

1. Field of the Invention

The present invention relates to a lithographic projection apparatus.

2. Description of the Related Art

Lithographic apparatus can be used, for example, in the manufacture of integrated circuits (ICs). In such a case, a patterning device may be used to generate a desired circuit pattern corresponding to an individual layer of the IC, and this pattern can be imaged onto a target portion (e.g. comprising one or more dies) on a substrate (silicon wafer) that has been coated with a layer of radiation-sensitive material (resist).

The term "patterning device" as here employed should be broadly interpreted as referring to a device that can be used to impart an incoming radiation beam with a patterned cross-section, corresponding to a pattern that is to be created in a target portion of the substrate; the term "light valve" can also be used in this context. Generally, the pattern will correspond to a particular functional layer in a device being created in the target portion, such as an integrated circuit or other device (see below). Examples of such patterning devices include:

a mask: the concept of a mask is well known in lithography, and it includes mask types such as binary, alternating phase-shift, and attenuated phase-shift, as well as various hybrid mask types. Placement of such a mask in the radiation beam causes selective transmission (in the case of a transmission mask) or reflection (in the case of a reflective mask) of the radiation impinging on the mask, according to the pattern on the mask. In the case of a mask, the support structure will generally be a mask table/holder, which ensures that the mask can be held at a desired position in the incoming radiation beam, and that it can be moved relative to the beam if so desired;

a programmable mirror array: one example of such a device is a matrix-addressable surface having a visco-elastic control layer and a reflective surface. The basic principle behind such an apparatus is that (for example) addressed areas of the reflective surface reflect incident light as diffracted light, whereas unaddressed areas reflect incident light as non-diffracted light. Using an appropriate filter, the non-diffracted light can be filtered out of the reflected beam, leaving only the diffracted light behind; in this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing piezoelectric actuation mechanism. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means. In both of the situations described here above, the patterning device can comprise one or more programmable mirror arrays. More information on mirror arrays as here referred to can be gleaned, for example, from U.S. Pat. No. 5,296,891 and U.S. Pat. No. 5,523,193, and PCT patent applications WO 98/38597 and WO 98/33096, which are incorporated herein by reference. In the case of a programmable mirror array, the support structure may be embodied as a frame or table, for example, which may be fixed or movable as required; and a programmable LCD array: an example of such a construction is given in U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table/holder; however, the general principles discussed in such instances should be seen in the broader context of the patterning device as set forth here above.

For the sake of simplicity, the projection system may hereinafter be referred to as the "lens"; however, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask table/holders). In such "multiple stage" devices the additional tables may be used in parallel, or preparatory steps may be carried out on one or more tables while one or more other tables are being used for exposures. Twin stage lithographic apparatus are described, for example, in U.S. Pat. No. 5,969,441 and U.S. Ser. No. 09/180,011, filed 27 Feb. 1998 (WO 98/40791), incorporated herein by reference.

In general, a single wafer will contain a whole network of adjacent target portions that are successively irradiated via the projection system, one at a time. In current apparatus, employing patterning by a mask on a mask table/holder, a distinction can be made between two different types of machine. In one type of lithographic projection apparatus, each target portion is irradiated by exposing the entire mask pattern onto the target portion in one go; such an apparatus is commonly referred to as a wafer stepper. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction. Since, in general, the projection system will have a magnification factor M (generally <1), the speed V at which the substrate table is scanned will be a factor M times that at which the mask table/holder is scanned. More information with regard to lithographic devices as here described can be gleaned, for example, from U.S. Pat. No. 6,046,792, incorporated herein by reference.

Typically, devices are provided between the illumination system and the patterning device to stop stray light from impinging on the patterning device, such devices are often referred to as masking devices. In general, masking devices comprise blades disposed in the illumination unit. One set of blades are arranged to move together and apart in one direction, the Y-direction, hereinafter referred to as the Y-blades. The Y direction is also generally the scanning direction. For the purposes of this application, unless otherwise stated the Y direction is the scanning direction.

Conventional masking devices may have drawbacks. In particular, the patterning device may contain more than one pattern of which only one is to be used for a given exposure. In these circumstances, it is desirable to ensure that only a certain part of the patterning device is illuminated by the projection beam or a certain part of the patterned projection beam is imaged to the substrate. Further, conventional masking devices cannot be relied upon to accurately obscure the patterning device. These problems may be exacerbated when, as discussed in more detail below, the lithographic apparatus operates in a step-and-scan mode. As higher scanning speeds are demanded, conventional masking devices fail further.

In particular, while in a scanning mode, due to the scanning mechanism of the conventional apparatuses in the acceleration and deceleration phases, the absence of a perfect black border on the patterning device causes the adjacent parts of the patterning device to be illuminated. That is, conventional apparatuses suffer from the problem that due to the high acceleration and deceleration required at the beginning and end phase of the scan to achieve the variable opening area required at the beginning and end of the scan, dynamic disturbances occur in the apparatus which threaten the machine's accuracy.

SUMMARY OF THE INVENTION

The principles of the present invention, as embodied and broadly described herein, provide for an apparatus and method which permits a desired part of a patterning device to be imaged on the substrate. In one embodiment, the lithographic apparatus comprises an illumination system configured to supply a beam of radiation, a support structure configured to support a patterning device that imparts a desired pattern onto the beam of radiation, a substrate holder configured to hold a substrate, a projection system configured to image the patterned beam onto a target portion of the substrate, and a spatial filter SF configured to selectively obstruct a portion of the patterned beam.

Such an arrangement provides an improved selectivity of the part of the patterning device that is imaged at the substrate. In addition, it is a cost effective solution, which optimizes the use of space in the lithographic apparatus and does not add complexity to the design of the apparatus.

According to a further embodiment of the invention, a lithographic apparatus is presented in which the spatial filter SF comprises a first and a second pair of spatial filtering structures disposed in a path of the projection beam, wherein the first pair of spatial filtering structures are disposed at a predetermined distance from each other in a direction, and the second pair of spatial filtering structures are disposed at a predetermined distance from each other in the same direction, wherein the second pair of spatial filtering structures are arranged to move with respect to the first pair of spatial filtering structures in the direction, to cause the projection beam to scan in the direction.

This arrangement provides an advantage that during scanning the first and second spatial filtering structures are not subjected to accelerations, which may cause dynamic disturbances in the apparatus. Thus, the accuracy with which the patterning device is imaged is increased.

In another embodiment, a lithographic apparatus is presented in which the spatial filter SF comprises an array of elements which are selectively switchable between a projection beam obstructing state and a projection beam transmitting state. Examples of such elements include mirrors or tunable gratings.

This arrangement provides an advantage that masking devices having a large movable mass, which therefore contribute to dynamic disturbances in the apparatus, can be dispensed with. Further, the array provides a compact solution, improving the use of space within a lithographic apparatus.

According to another embodiment of the invention, there is provided a device manufacturing method comprising providing a substrate that is at least partially covered by a layer of radiation-sensitive material, providing a beam of radiation using an illumination system, providing a support structure configured to support a patterning device, configuring the beam of radiation with a desired pattern in its cross-section based on the patterning device, projecting the patterned beam of radiation onto a target area of the layer of radiation-sensitive material, and selectively obstructing a portion of the patterned beam via a spatial filter.

In a manufacturing process that uses a lithographic projection apparatus, according to the present invention, a pattern (e.g. in a mask) is imaged onto a substrate that is at least partially covered by a layer of energy-sensitive material (resist). Prior to this imaging task, the substrate may undergo various procedures, such as priming, resist coating and a soft bake.

After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallisation, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target area", respectively.

In the present document, the terms illumination radiation and illumination beam are used to encompass all types of electromagnetic radiation, including ultra-violet radiation (e.g. with a wavelength of 365, 248, 193, 157 or 126 nm) and EUV, as well as particle beams, such as ion beams or electron beams.

BRIEF DESCRIPTION OF DRAWINGS

Embodiments of the invention will now be described, by way of example only, with reference to the accompanying schematic drawings in which.

In the Figures, corresponding reference symbols indicate corresponding parts.

DETAILED DESCRIPTION OF THE INVENTION

Figure 1:
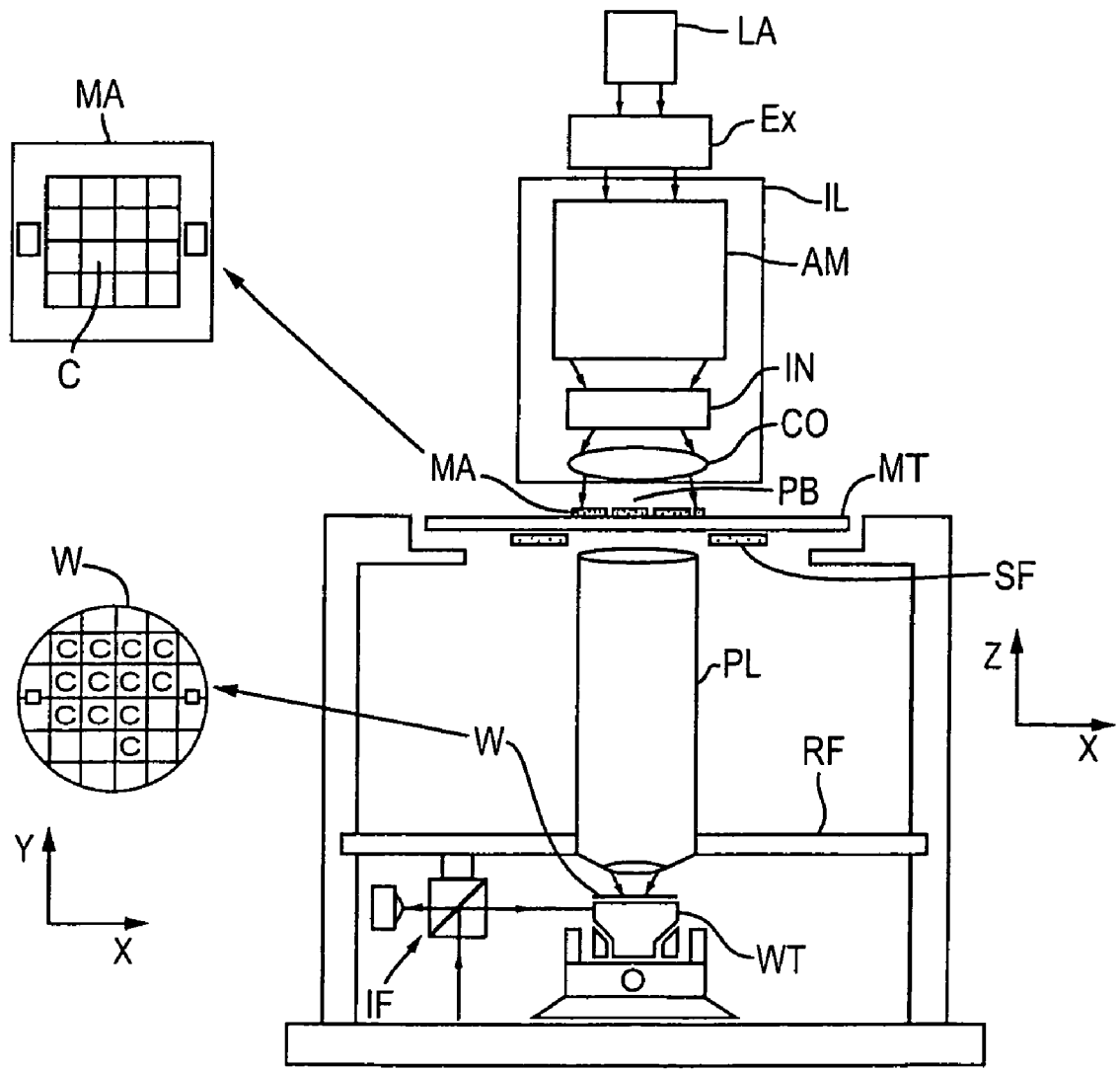
FIG. 1 depicts a lithographic projection apparatus, according to an embodiment of the invention.
Figure 2:
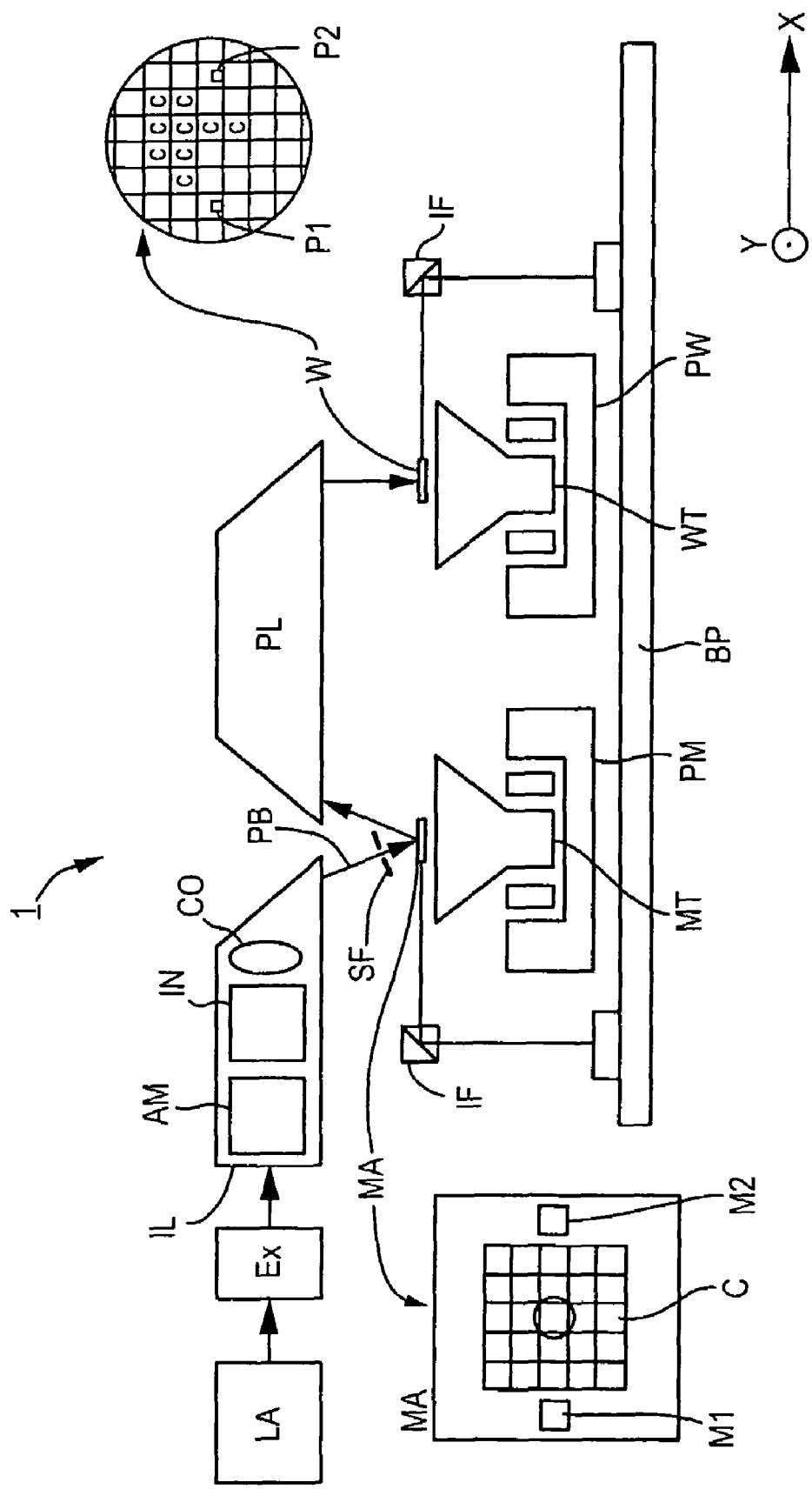
FIG. 2 depicts a lithographic projection apparatus according to a further embodiment of the invention.

FIGS. 1 and 2 schematically depict a lithographic projection apparatus according to an embodiment of the invention. The apparatus comprises:

an illumination system Ex, IL: for supplying a projection beam PB of radiation (e.g. EUV, DUV, or UV radiation). In this particular case, the radiation system also comprises a radiation source LA;

a first object table (mask table/holder/holder) MT: provided with a mask holder for holding a mask MA (e.g. a reticle), and connected to first positioning mechanism for accurately positioning the mask with respect to item PL;

a spatial filter SF: for example, a reticle masking device, also known in the art as a "rema" that is provided for selectively obstructing a part of the projection beam impinging on the mask or a part of the patterned beam;

a second object table (substrate table/holder) WT: provided with a substrate holder for holding a substrate W (e.g. a resist-coated silicon wafer), and connected to second positioning mechanism for accurately positioning the substrate with respect to item PL;

a projection system ("lens") PL: for example, a mirror or refractive lens system that images an irradiated portion of the mask MA onto a target portion C (comprising one or more dies) of the substrate W.

As depicted in FIG. 1, the apparatus is of a transmissive type (i.e. has a transmissive mask). However, as depicted in FIG. 2, it may also be of a reflective type, for example (with a reflective mask). Alternatively, the apparatus may employ another kind of patterning device, such as a programmable mirror array of a type as referred to above.

The illumination system may comprise a source LA (e.g. a mercury lamp, a Krypton-Fluoride excimer laser or a plasma source) that produces a beam of radiation. This beam is fed into an illumination system (illuminator) IL, either directly or after being passed through conditioning means, such as a beam expander Ex, for example. The illuminator IL may comprise adjusting means AM for setting the outer and/or inner radial extent (commonly referred to as σ-outer and σ-inner, respectively) of the intensity distribution in the beam. In addition, it will generally comprise various other components, such as a condenser CO and an integrator IN. The integrator IN projects the incoming light into the condenser CO. The integrator IN may, for example, be formed of a quartz rod, and is used to improve the intensity distribution of the beam to be projected over the cross section of the beam. The integrator thus improves the illumination uniformity of the projection beam PB. In this way, the beam PB impinging on the mask MA has a desired uniformity and intensity distribution in its cross-section.

It should be noted with regard to FIG. 1 and FIG. 2 that the source LA may be within the housing of the lithographic projection apparatus, but that it may also be remote from the lithographic projection apparatus, the radiation beam which it produces being led into the apparatus (e.g. with the aid of suitable directing mirrors). The current invention and claims encompass both of these scenarios.

In FIG. 1, a spatial filter SF is disposed in the path of the patterned beam so in the example, shown in FIG. 1, the spatial filter SF is disposed downstream in the direction of the projection beam between the mask and the substrate. In FIG. 2, a spatial filter SF is disposed upstream in the direction of the projection beam between the source of the projection beam and the mask. Thus, according to embodiments of the invention, the spatial filter SF may be disposed either prior or subsequent to reflection or transmission by the mask supported on the support structure MT. For example, the embodiments described with respect to the FIGS. 9-12 may be disposed either above the support structure supporting the patterning device or below the support structure supporting the patterning device.

Those parts of the projection beam PB or patterned beam falling on an area of the spatial filter SF which obstructs the projection beam or patterned beam will preferably be reflected or absorbed. Only those parts of the projection beam or patterned beam not falling on an area of the spatial filter SF which obstructs the projection beam or patterned beam will be transmitted. The spatial filter SF is arranged as described below. However, generally, the spatial filter SF forms a "slit". As discussed below, the masking device is controllable to control the dimensions of the slit through which the projection beam passes. The spatial filter SF is preferably disposed in proximity of the mask MA.

Either before passing through the spatial filter SF such as shown in FIG. 1, or shortly after passing through the spatial filter, such as shown in FIG. 2, the beam PB intercepts the mask MA which is held in a mask holder on a mask table/holder MT. Having been transmitted through or reflected by the mask MA, the patterned beam is spatially filtered, such as shown in FIG. 2, if the projection beam has not already been spatially filtered prior to interception with the mask MA.

Subsequently or otherwise, the beam PB passes through the lens PL, which focuses the beam PB onto a target portion C of the substrate W. With the aid of the second positioning mechanism (and interferometric measuring means IF), the substrate table/holder WT can be moved accurately, e.g. so as to position different target portions C in the path of the beam PB. Similarly, the first positioning mechanism can be used to accurately position the mask MA with respect to the path of the beam PB, e.g. after mechanical retrieval of the mask MA from a mask library, or during a scan. In general, movement of the object tables MT, WT can be realized with the aid of a long stroke module and a short stroke module or a combined module, which are not explicitly depicted in FIG. 1. However, in the case of a wafer stepper (as opposed to a step-and-scan apparatus), the mask table/holder MT may just be connected to a short stroke actuator, or may be fixed.

The apparatuses depicted in FIGS. 1 and 2 can be used in different modes:

step mode: the mask table MT is kept essentially stationary, and an entire mask image is projected in one go (i.e. a single "flash") onto a target portion C. The substrate table WT is then shifted in the X and/or Y directions so that a different target portion C can be irradiated by the beam PB;

scan mode; essentially the same scenario applies, except that a given target portion C is not exposed in a single "flash". Instead, the mask table MT is movable in a given direction (the so-called "scan direction", e.g. the Y-direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution; and other mode: the mask table MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Figure 3:
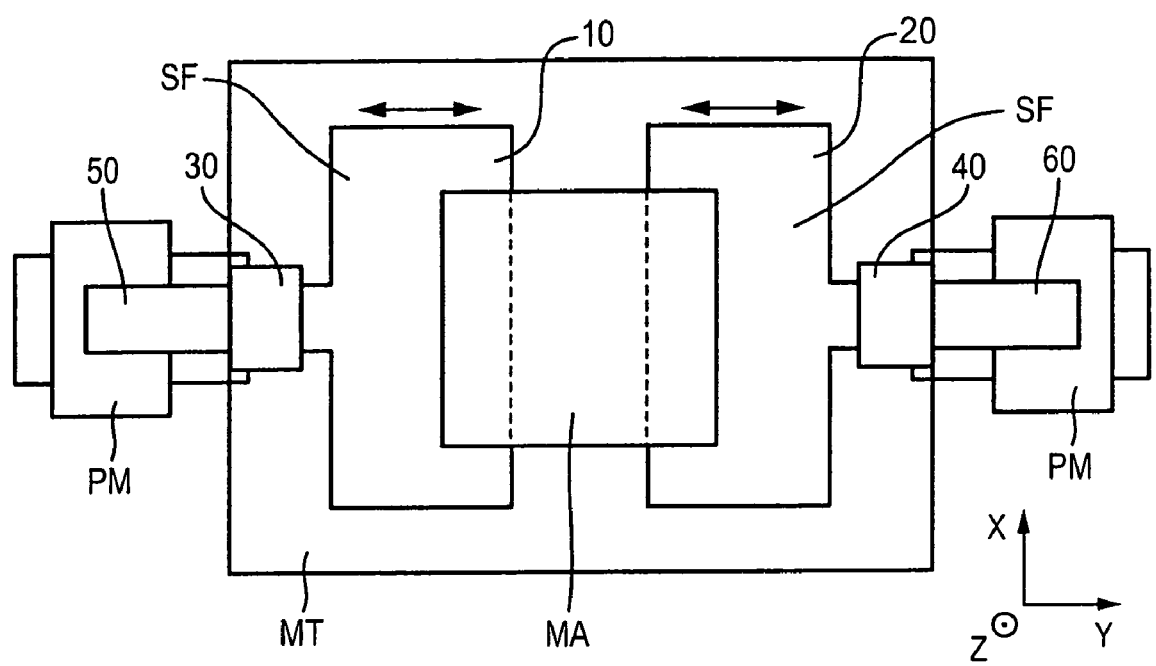
FIG. 3 shows a plan view in the X-Y plane of a mask table/holder having a first embodiment of the spatial filter SF provided thereon.

FIG. 3 shows in plan view a mask table/holder MT having a mask MA provided thereon. There is also shown a first embodiment of the spatial filter SF. The spatial filter SF comprises first and second filtering structures. The filtering structures may comprise plates or blades or other constructions suitable for selectively obstructing the patterned beam. The spatial filter SF may comprise two movable blades 10, 20 arranged to selectively obscure part of the patterned beam. The blades are movable together and apart in the Y-direction, which is also the direction of scanning of the mask.

Figure 4:
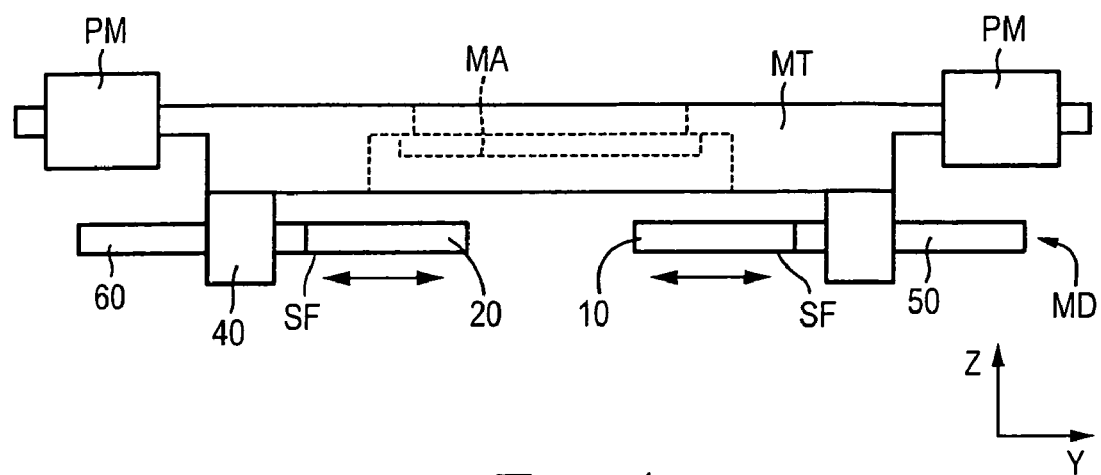
FIG. 4 shows a cross section in the Y-Z plane of the mask table/holder and spatial filter SF of FIG. 3.
Figure 5:
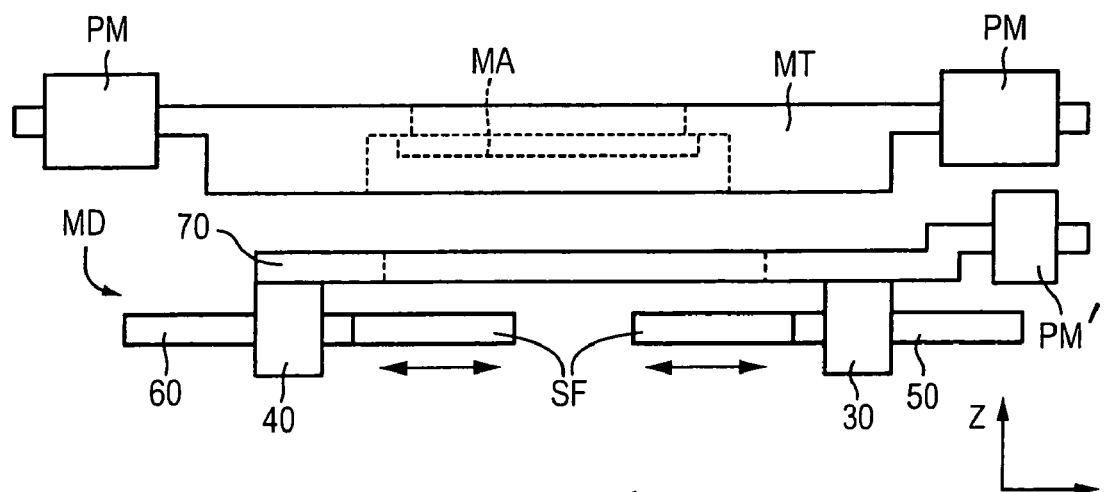
FIG. 5 shows a cross section in the Y-Z plane of the mask table/holder having a second embodiment of the spatial filter SF provided thereon.

As shown in FIG. 3, the blades 10, 20 are mechanically coupled to the mask table/holder MT such that they are movable in the directions indicated by the arrows (i.e. left/right as shown in FIGS. 3, 4 and 5). This coupling is achieved, for example, via linear motors 30, 40 which engage with elongated parts 50, 60 of the blades 10, 20.

The mask table/holder MT is itself movable by means of positioning mechanism PM which are shown as linear motors in FIGS. 3, 4, and 5. It will be appreciated that the construction shown serves to provide that the spatial filter SF moves with the mask table/holder MT because it is mechanically coupled to it. The blades can be made of any appropriate material which in general comprise materials that can withstand the radiation, are rigid and are lightweight. A metal, for example aluminum, or a ceramic are ideal because they have the advantage that the spatial filter SF structure can include one or more cooling channels in it as described in our copending unpublished European application (applicant's reference P-1567.000-EP), which is hereby incorporated by reference.

In other embodiments, the spatial filter SF can be magnetically or electrostatically coupled to the mask table/holder MT. The spatial filter SF may also be configured to be demountable. Alternatively, the spatial filter SF can be coupled to the long-stroke or short-stroke module of the positioning mechanism PM rather than the mask table/holder MT, as described with reference to FIGS. 7 and 8 below.

In conventional lithographic apparatuses, a spatial filter SF comprising blades is disposed upstream in the direction of the projection beam between the source of the projection beam and the patterning device. However, a further problem with conventional lithographic apparatuses is that, due to the acceleration and deceleration phases of the scanning mechanism, the absence of a perfect black border on the mask (reticle) can cause adjacent areas of the substrate (dies) to be illuminated. This is undesirable because only the area (die) to be exposed should be illuminated. According to an embodiment of the invention, a solution to this problem has been found which does not result in the restriction of the size of the radiation beam at its edges, because this would result in edge portions of the areas for exposure (dies) not being sufficiently illuminated.

In particular, the spatial filter SF is disposed in the path of the patterned beam, i.e. downstream in the direction of the projection beam between the patterning device and the substrate. Preferably, the spatial filter SF is disposed directly adjacent to the mask, as close as possible to the mask, in order to prevent beam spreading. This arrangement provides an advantage in that because the beam is restricted in close proximity to the site at which the beam is patterned, any beam spreading effect is minimized. Thus, even during acceleration and deceleration phases, illumination of adjacent areas of the substrate (dies) is reduced. Further, this solution can have an advantage of not contributing further to the cost or complexity of the apparatus.

Thus, as in FIG. 3, the patterning device disposed on mask table/holder MT is disposed upstream of the spatial filter SF. The direction of the projection beam is into the plane of the paper in the Z direction, as indicated.

In a scanning mode, the blades 10, 20 are disposed so as to be able to move with the mask MA during scanning. In order to facilitate any adjustments to the size of the illumination field, the blades can be moved with respect to the mask MA. This however usually does not take place during scanning or during exposure in a step mode, but rather between exposures.

FIGS. 4 and 5 show cross sections in the Y-Z plane of embodiments of the spatial filter SF of the present invention. In FIG. 4, the spatial filter SF is coupled to the support structure MT as was shown in FIG. 3.

In FIG. 5, the spatial filter SF is not directly coupled to the support structure MT. Instead, in the embodiment shown, the spatial filter SF is attached to another part of the lithographic apparatus, such as a frame (shown in for example FIG. 1), by a second positioning mechanism PM'. The positioning mechanism PM' may, for example, be a linear motor which serves to move a support 70 such that the spatial filter SF is always correctly aligned with the mask. In this embodiment, the motors 30, 40 are still used to adjust the position of the blades 10, 20. The positioning mechanism PM' serves to account for any adjustments made to the mask table/holder MT by the positioning mechanism PM. Appropriate servo control may be provided for moving the blades 10,20 at the same speed as the mask MA during a scanning motion.

In a further embodiment of the present invention the blades 10, 20 are moved by remote means (not shown), such as a robot arm. The robot arm may, for example, be the same robot arm provided to dispose the mask MA on the mask table/holder MT. In particular, the remote means moves the blades to the correct position with respect to the mask table/holder MT, and then further allows the blades to be coupled to the mask table/holder MT. It is added that the remote means are not generally active during scanning.

Figure 6:
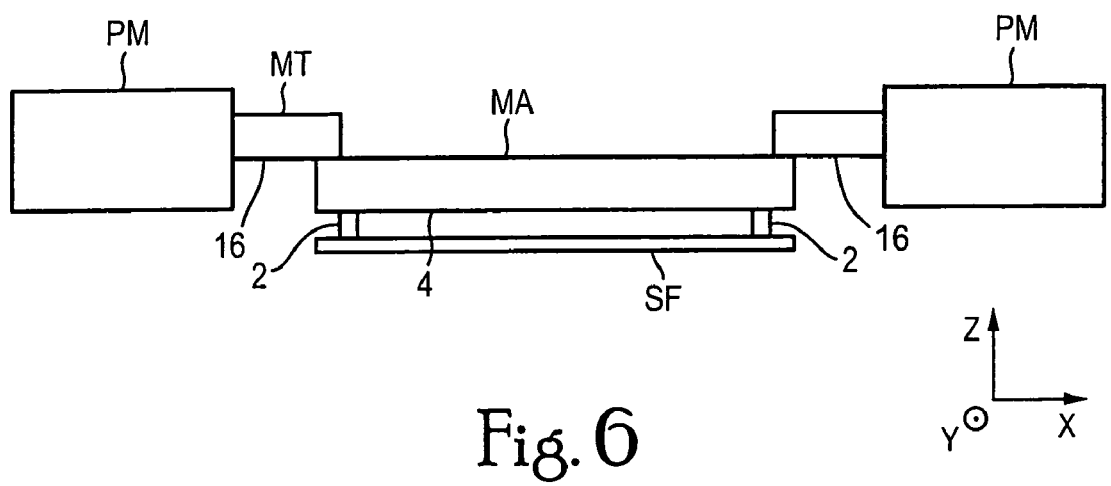
FIG. 6 shows a side view in the X-Z plane of a mask table/holder having spatial filter SF according to an embodiment of the invention.
Figure 7:
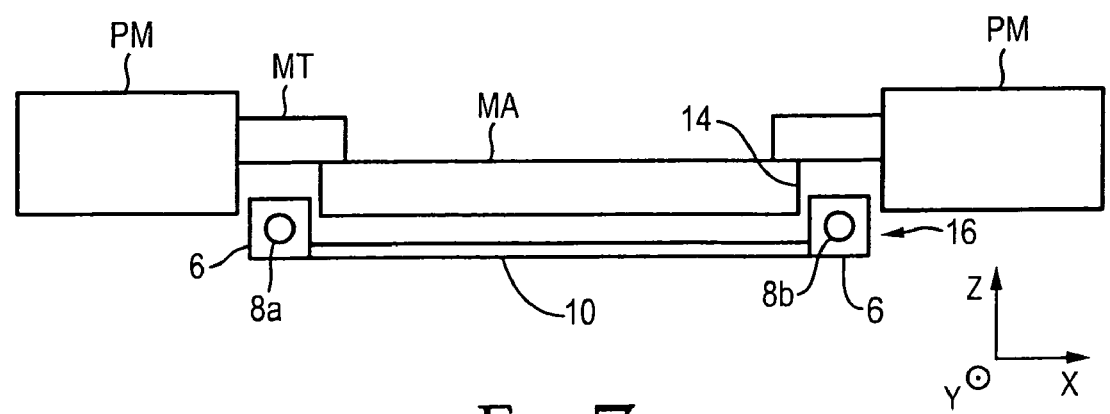
FIG. 7 shows a side view in the X-Z plane of a mask table/holder having a spatial filter SF according to a further embodiment.

FIGS. 6 and 7 show cross sections of embodiments of the present invention in the X-Z plane. With reference to FIG. 6, spatial filter SF is mounted on a downstream side 4 of the patterning device MA. Also provided is coupling device 2, which serves to couple the filter SF to the patterning device or the patterning device support structure. The coupling device 2 is controllable to detachably couple the filter to the patterning device. Alternatively, the coupling device 2 may be arranged to couple the spatial filter SF to the downstream surface 16 of the support structure MT.

Adjustment of the radiation passing area of the filter is realised in the following way: once the filter has been decoupled from the support structure MT or patterning device MA, the support structure is moved to a desired scanning position, after which the filter is coupled to the support structure or patterning device by a robot arm (not shown). The coupling device may comprise a clip or a deformable hinge or the like, or any other means suitable for attaching the filter to the surface of either the patterning device MA or support structure MT.

The support structure may also comprise reticle pins (not shown). Reticle pins are used in the process of loading and unloading the mask to and from the mask table/holder. An external robot arm puts the mask on the retractable pins. Once the mask is in position on the pins, the pins are withdrawn through a surface of the mask table/holder, thus lowering the mask onto the surface of the mask table/holder. As mentioned previously, the external robot arm is also suitable for uncoupling the blades for readjustment purposes. For example, when a new image is to be exposed, the spatial filter SF is relocated to the position on the reticle where the new image is located. This is carried out by the robot arm described above.

With reference to FIG. 7, the spatial filter SF is mounted on a spindle system 6, 8 of the drive system PM of the support structure, preferably on the long stroke drive module 16. In general, in the lithographic apparatuses shown in the figures, a mask MA, a mask table/holder MT and a long stroke module are provided. Also provided between the mask table/holder MT and the long stroke module may be a short stroke module comprising short stroke actuators. The short stroke actuators comprise two parts. Typically, the first part is attached to the mask table/holder MT and the second part is attached to the long stroke module. The two parts preferably do not come into contact with each other.

Figure 8:
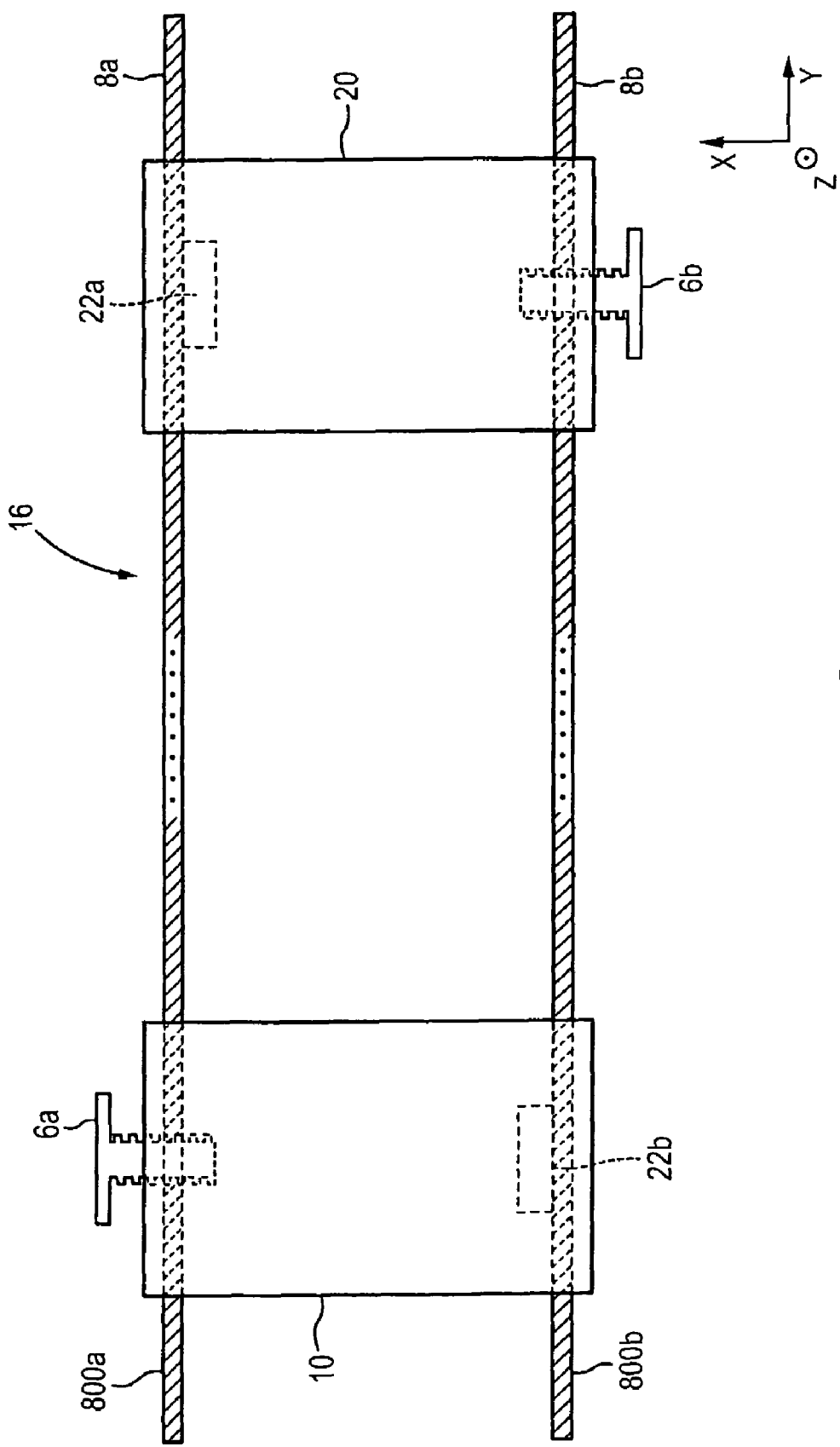
FIG. 8 shows a plan view in the X-Y plane of aspects of the spatial filter SF as shown in FIG. 7.

The spindle system 6,8 preferably comprises a spindle, such as a bolt 8 and a nut 6 in the example shown in FIGS. 7 and 8. The function of the spindle system 6, 8 is to adjust the position of the filter 10 in the Y direction with respect to patterning device located on the support structure MT. As can be seen the filter 10 is mounted on a downstream side 14 of the mask MA. The spindle 8 extends in the Y direction. Two spindles 8a, 8b are provided to provide support to opposite ends of the blade 10 and/or 20 in the X direction. In order to effect a translation of the blade 10 and/or 20 in the Y direction, the spindles are rotated whilst keeping the bolts 6 stationary. To effect rotation of the spindles, they are connected to the long stroke module.

FIG. 8 shows a plan view of the long stroke module 16 in the X-Y plane, in which the projection beam in the Z direction projects out of the plane of the paper. The long stroke module 16 comprises a first spindle 8a and a second spindle 8b. The spindles 8a and 8b are provided with a screw thread 800a, 800b, respectively. The screw thread, which may for example be square shaped, is present on the spindles 8a, 8b. Nuts 6a, 6b having a screw thread which matches the screw thread provided on the spindles 8a, and 8b, respectively, are provided. The first nut 6a is connected to the first blade 10. The second nut 6b is connected to the second blade 20. When the spindles 8a, 8b are turned, the corresponding nut 6a, 6b will move and drive the corresponding blade 10, 20, respectively.

Also provided are bushes 22a, 22b, which are preferably cylindrical elements, which can slide over the top of the screw thread, and as such provide a bearing function for the blades 10, 20, respectively. The first bush 22a is arranged to slide over the first spindle 8a and is connected to the second blade 20. The second bush 22b is arranged to slide over second spindle 8b and is connected to the first blade 10. In this way a first filter portion, blade, 10 is supported on the first spindle 8a and a second filter portion, blade, 20 is supported on the second spindle 8b. The first spindle 8a guides the second filter portion 20 and the second spindle 8b guides the first filter portion 10. As mentioned, the bushes, also referred to as sliders 22a, 22b, are disposed on the spindle and are able to move along the spindle without generating motion when the spindles rotate. The sliders 22 provide a guide surface for the blades 10, 20. It is seen from FIG. 8 that the spindle drive and guiding of the first and second filter portions are integrated. The spindle drive of the first blade being the guiding of the other and vice versa. The spindle preferably comprises a ceramic material, since the spindle is required to have a certain stiffness.

Figure 9:
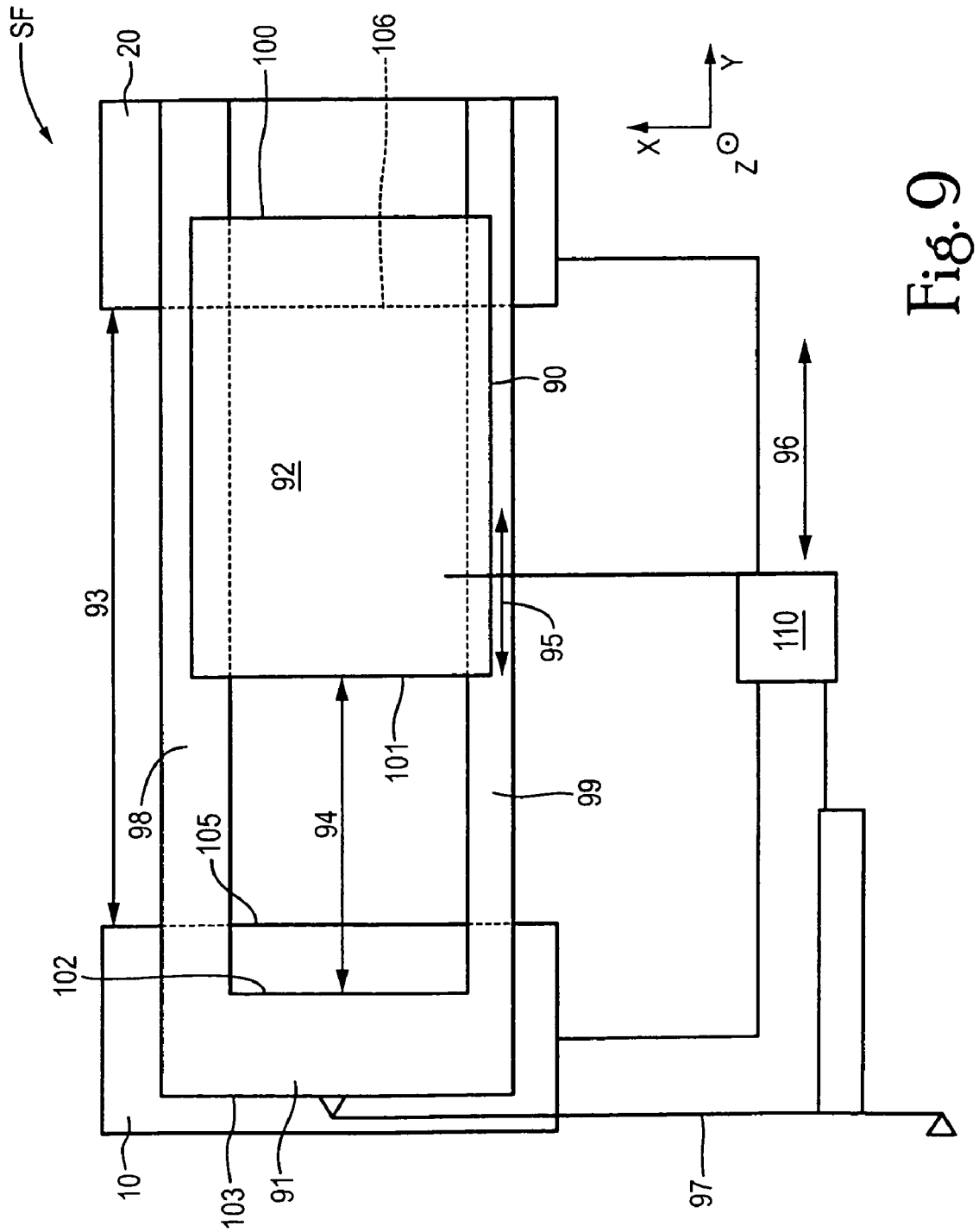
FIG. 9 shows a plan view in the X-Y plane of a spatial filter SF according to a further embodiment of the present invention.

FIG. 9 shows a plan view in the X-Y plane of a spatial filter SF according to an embodiment of the invention. The spatial filter SF shown is suitable for use in the apparatuses shown in FIGS. 1 and 2. Further, it may be disposed in any location in the apparatus. Preferably, however, it is disposed in the path of the projection beam either directly upstream or downstream of the patterning device in the direction of the projection beam. In other words, it is desirable to dispose spatial filter SF either between the illumination unit IL and the patterning device or between the patterning device and the substrate W. In both cases, it is preferably disposed in proximity of the patterning device, for example directly upstream or directly downstream. This particular arrangement provides an advantage of preventing beam spreading.

FIG. 9 shows a spatial filter SF comprising a first and a second pair of spatial filtering structures 10, 20, 91, 92. The filtering structures comprise plate like portions provided with a blade portion (as is shown in detail in FIG. 10). Typically, however the filtering structures comprise blades, preferably moveable blades. The first and second pairs of filtering structures are disposed in a path of the projection beam. The filtering structures 10, 20 of the first pair are disposed at a distance from each other 93 which defines the scanning length of the scan. The spatial filtering structures 91, 92 of the second pair are disposed at a distance from each other 94 in the same direction. The blades are disposed in the scanning direction. Each filtering structures of a pair may be moveable with respect to each other. Blade 10, for example, is movable with respect to blade 20.

Similarly, blade 92 is movable along support portions 90 in direction 95 with respect to blade 91. Preferably, the second pair of spatial filtering structures are disposed downstream of the first pair of spatial filtering structures in a direction of projection of the projection beam. Further, the illumination system IL of FIGS. 1 and 2 causes the projection beam to be focused at a focal plane, and that the first and second pair of spatial filtering structures are preferably disposed in the focal plane.

In one embodiment, the second pair of filtering structures comprises a U shaped portion 91, 98, 99. The U-shaped portion supports a blade 92, however additional blade support means may also be provided. The mid-portion 91 of the U-shaped portion forms the second blade of the second pair. It is seen in FIG. 9, that the portions 98, 99 of the U-shaped portion of the second pair of filtering structures define a distance in the X-direction. In an embodiment of the invention, the distance defined between the blades in the X-direction is the exposure window in the X-direction. However, in another embodiment, this distance does not necessarily define the exposure window and an additional set of blades (not shown) is provided to fulfill this function. In that case portions 98, 99 may not be necessary. The blades of the embodiment shown preferably comprise the materials described with reference to the blades shown in FIGS. 3-8.

The second pair of filtering structures is arranged in use to move with respect to the first pair of spatial filtering structures in the scanning direction. In doing so, a scanning projection beam is transmitted by the filtering structures. Movement of the second pair of filtering structures may be achieved by mechanical means as shown in FIG. 9, where a cantilever mechanism 97 connected to mask table/holder long stroke module 16 is arranged to move the U-shaped portion 90, 98, 99 and the blade 92 in the Y direction in synchronization with the mask. Alternatively, the second movement may be electrically driven, wherein the moving pair of blades are provided with an actuator system (not shown) which is electrically synchronised with the mask table/holder long stroke module 16.

During operations, the first set of blades 10, 20 is fixed, for example, to the frame of the apparatus, although the distance between the blades can be adjusted in between scans. The second set of blades 90, 98, 99, 92 are arranged to move synchronously with the patterning device. The distance between the blades is kept constant during each scan. It will be understood that depending on the location of the spatial filter SF in the apparatus with respect to the projection beam, a certain gear ratio between the velocity of the patterning device and the second pair of filtering structures will be required.

This arrangement provides the advantage that although the second pair of filtering structures is moved, large accelerations and decelerations of the blades is avoided. Assuming blades 91 and 92 move in the Y direction, that is to the right as shown in FIG. 9, as the lead edge 101 of blade 92 passes edge 105 of blade 10, the scanning window begins its opening phase, when the lead edge 102 of blade 91 passes over blade 10, the scanning blade is fully open. As the lead edge 101 of blade 92 passes lead edge 106 of blade 20, the scanning window begins its closing phase and when the lead edge 102 of blade 91 passes edge 106 of blade 20, the scanning window is fully closed. The distance 93 between the blades of the first pair of filtering structures defines the scanning length. The distance between the blades of the second pair of filtering structures defines the slit width. The distance between the arms of the U-shaped portion 98, 99, is controllable. In one embodiment, this distance defines the slit height of the scanning beam. However, in another embodiment the slit width is determined by an additional set of X-blades (not shown).

It will be understood that the dimensions of the filtering structures of the second pair, in particular, the dimensions of the U-shaped portion and blade 92 will depend on the particular scanning slit width and scan length required. For example, in order to avoid stray light impinging on the patterning device or substrate, the portion 91 joining the arms of the U-shaped portion may extend further in the Y direction.

The spatial filter SF shown in FIG. 9 also preferably includes a control means 110, such as a computer for controlling the scanning profile. This is achieved by a control signal sent from the control means to the first and second filtering structures and the drive mechanism for the second filtering structures.

Figure 10:
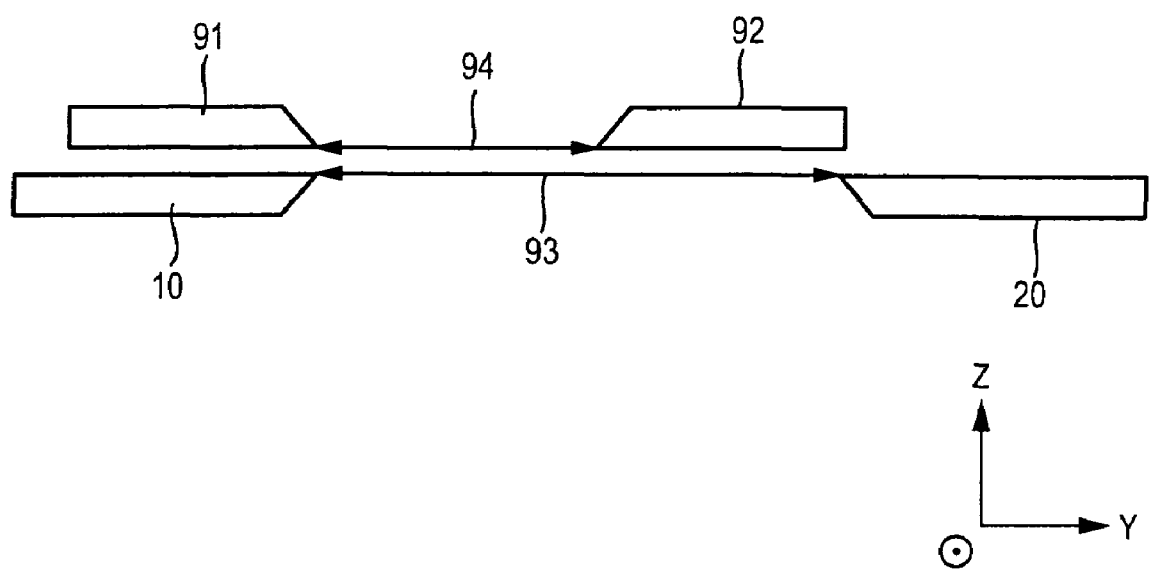
FIG. 10 shows a cross section in the Y-Z plane of the spatial filter SF shown in FIG. 9.

FIG. 10 shows a cross section view of the first 10, 20 and second 91, 92 pairs of filtering structures of FIG. 9 in the Y-Z plane. In particular, FIG. 10 shows that filtering structures may comprise plate like structures, preferably having a blade portion at one end. In the art however, the combined structure is often referred to as a "blade". FIG. 10 also shows that the distance 93 between the first blades 10, 20 defines the scanning length and the distance 94 between the second blades 91, 92 defines the scanning slit width.

Figure 11:
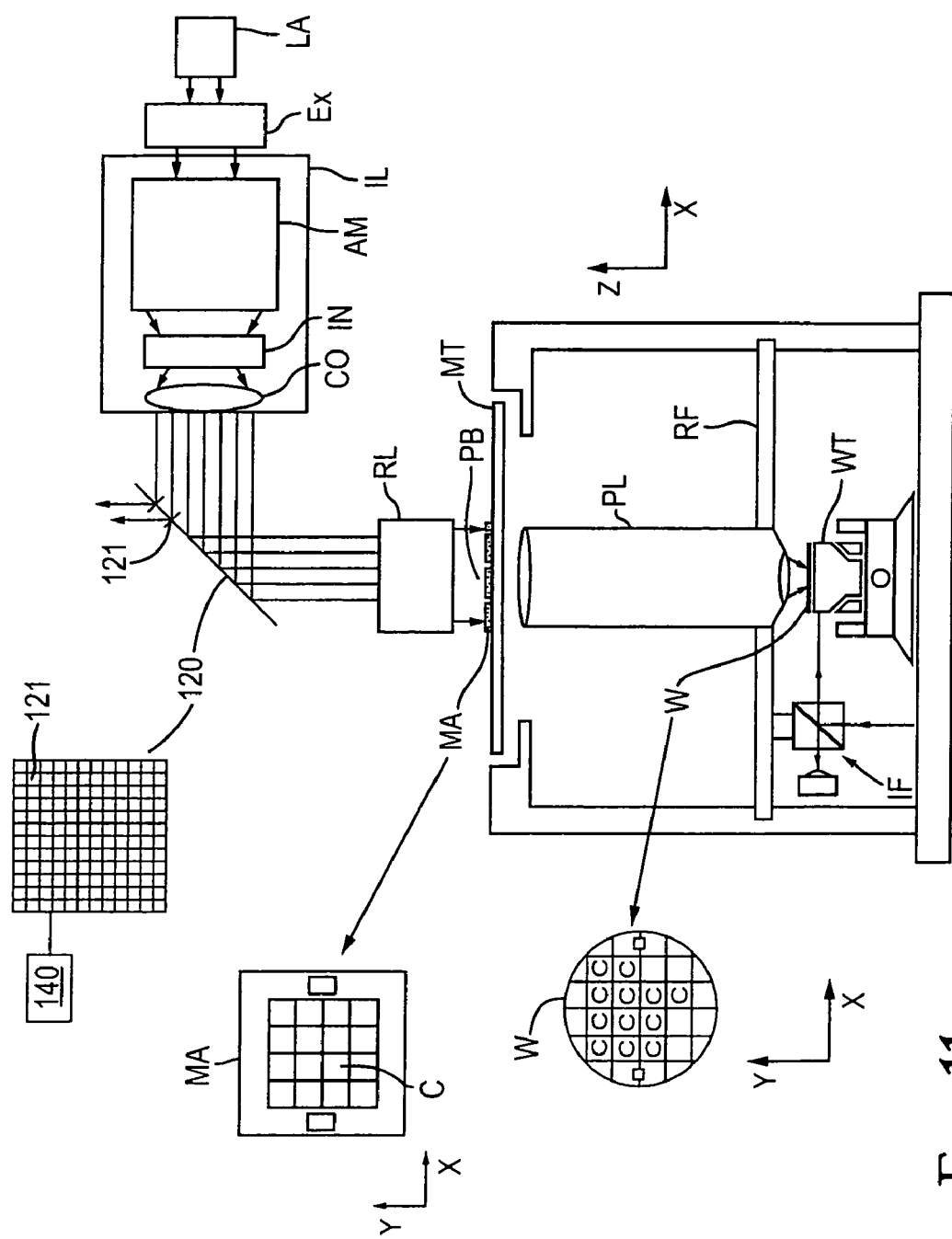
FIGS. 11 and 12 show a spatial filter SF according to further embodiments of the present invention.
Figure 12:
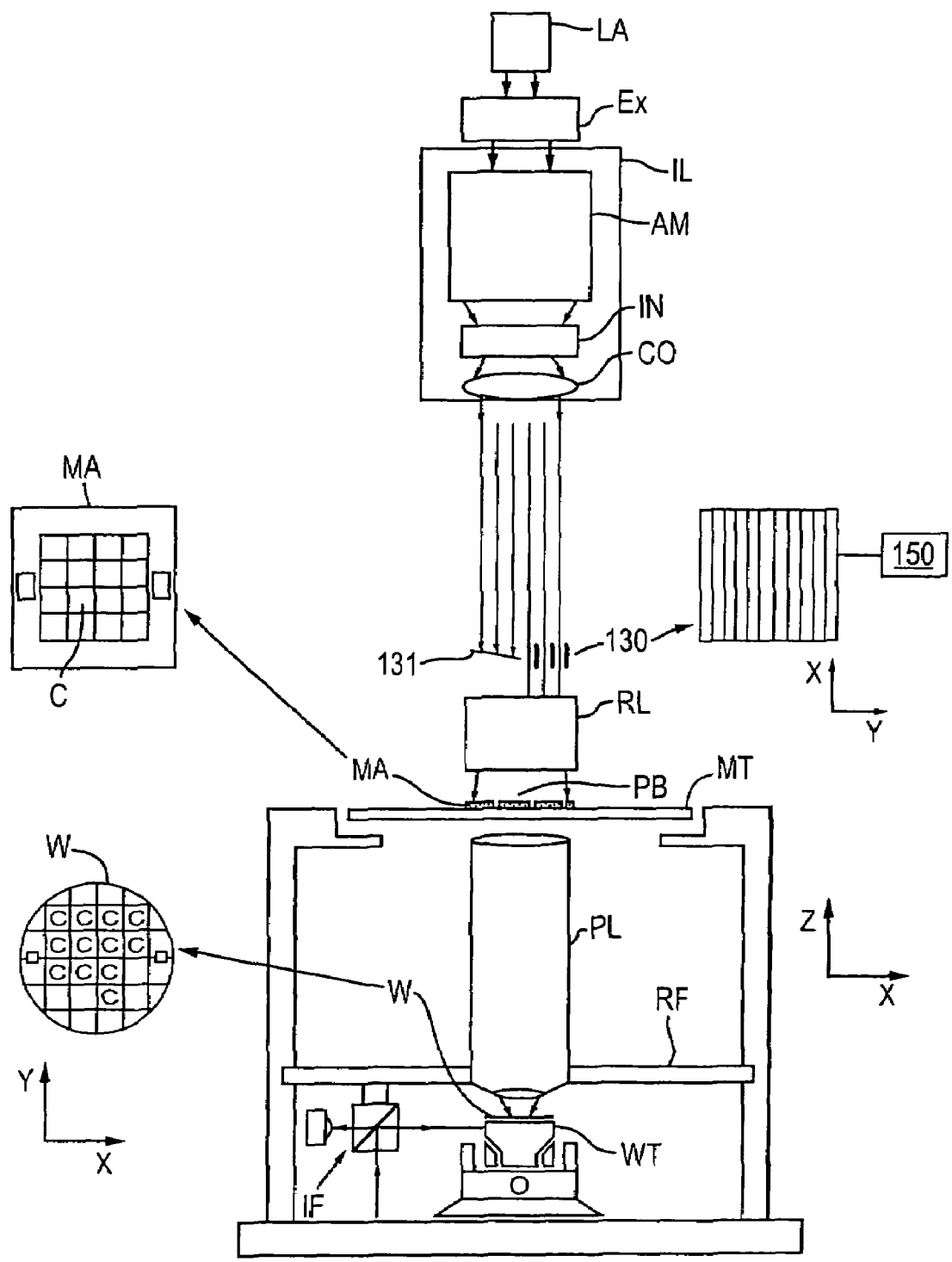

FIGS. 11 and 12 show further embodiments of the present invention. The spatial filters 120, 130 shown in the embodiments are applicable to the apparatuses shown in FIGS. 1 and 2. However, it will be understood that some adjustment of the apparatus components may be required for the incorporation of the spatial filter SF shown in FIGS. 11 and 12.

As mentioned previously, a problem with conventional spatial filters, especially in the scanning mode, is that the movable blades are required to accelerate and decelerate extremely fast which can cause dynamic disturbances in the apparatus which threaten the accuracy of the apparatus. Furthermore, conventional spatial filters, in particular filters having several moving components, require space to move, which is scarce in lithography apparatuses, especially apparatuses operating in the EUV range.

Conventional spatial filters having moving blade arrangements can be dispensed with, if the spatial filter SF comprises an array of elements which are selectively switchable between a projection beam obstructing state and a projection beam transmitting state. In other words, if the spatial filter SF can be made locally transparent or locally reflective and/or absorptive, the moving blades of conventional spatial filters can be avoided.

FIGS. 11 and 12 depict embodiments of this aspect of the present invention as applied in a lithographic projection apparatus. The apparatus comprises:

a radiation system Ex, IL, RL: that supplies a projection beam PB of radiation;

a spatial filter SF 120, 130: is provided for selectively obstructing a part of the projection beam;

a first object table (mask table/holder) MT: that is provided with a mask holder for holding a mask MA, and connected to first positioning mechanism for accurately positioning the mask with respect to item PL;

a second object table (substrate table) WT: that is provided with a substrate holder for holding a substrate W, and connected to second positioning mechanism for accurately positioning the substrate with respect to item PL;

a projection system ("lens") PL: that images an irradiated portion of the mask MA onto a target portion C (comprising one or more dies) of the substrate W.

FIGS. 11 and 12 depict, an apparatus of a transmissive type (i.e. has a transmissive mask). However, in general, it may also be of a reflective type, for example (with a reflective mask). Alternatively, the apparatus may employ another kind of patterning device, such as a programmable mirror array of a type as referred to above. The operation of the lithographic apparatus is described generally above in reference to FIGS. 1 and 2.

The radiation system optionally includes a rema lens RL disposed between the illuminator IL and the mask MA. The rema lens RL is an assembly mounted in the lithography apparatus that typically contains expansion optics, a mirror for directing the projection beam toward the mask, a further condenser lens and a projecting lens, for example a unicom. The function of the rema lens RL is to sharply image the rema "image" plane on to the reticle mask "focus" plane. Thus, the rema lens RL functions to image the edges of the masking image with a sufficiently small edge width, match the entrance pupil function of the projection lens, and provide a uniform illumination of the mask MA.

In FIG. 11, the projection beam emerging from the illumination unit IL is incident on an array of elements 120, such as, for example, a micro mechanical mirror array. The array 120 is two-dimensional comprising a plurality of individually addressable micro mirrors 121. The array 120 is disposed in the apparatus so that light incident on mirrors in the transmitting state is reflected towards the patterning device disposed on the support structure MT and that light incident on the mirrors in the obstructing state is reflected not towards the patterning device. The spatial filter SF 120 preferably, further includes control means 140, such as a computer for controlling the addressable mirrors.

In addition to micromechanical mirrors, the array 120 may comprise electrically switchable mirrors, i.e./mirrors that can be electrically switched between a transmissive and a reflective state, such as liquid crystal arrays. In this case, the array would be disposed in a plane perpendicular to the incident projection beam, rather than at an angle to it, as is the case for the micro mechanical mirror array.

FIG. 12 shows a spatial filter SF comprising an array, according to a further embodiment. In FIG. 12, the projection beam emerging from the illumination unit IL is incident on a spatial filter SF comprising a plurality of addressable lamellae 130. The array is a one-dimensional array of elements extending in the scanning direction. Each of the lamellae 130 is moveable between a projection beam transmitting position and a projection beam obstructing position. In the obstructing position the projection beam is prevented from being transmitted between adjacent elements. The lamellae 130 are arranged so that when a first lamellae is in its obstructing state as well as a second lamellae adjacent the first lamellae, the lamellae overlap one another. The array may be described as a Venetian blind arrangement. The spatial filter SF 130 preferably also comprises a control means 150, such as a computer for controlling the individual lamellae for actuating the array.

The embodiments shown in FIGS. 11 and 12 are applicable to apparatuses in both the static and scanning modes, but have particular application to the scanning modes. In particular, the micro mechanical mirrors are switchable at very high rates, which lead to increased scanning speeds. The arrangements shown in FIGS. 11 and 12 provide a compact and versatile solution with respect to conventional spatial filters.

While specific embodiments of the invention have been described above, it will be appreciated that the invention may be practiced otherwise than as described. As such, the description is not intended to limit the invention. The configuration, operation, and behavior of the present invention has been described with the understanding that modifications and variations of the embodiments are possible, given the level of detail present herein. Thus, the preceding detailed description is not meant or intended to, in any way, limit the invention—rather the scope of the invention is defined by the appended claims.

What is claimed is:

1. A lithographic apparatus, comprising:
an illumination system configured to condition a beam of radiation;
a support configured to support a patterning device that imparts a desired pattern to the beam of radiation;
a substrate holder configured to hold a substrate; and
a projection system configured to project the patterned beam onto a target portion of the substrate; and
a spatial filter configured to selectively obstruct a portion of the patterned beam;
wherein the spatial filter comprises a first pair and a second pair of spatial filtering structures disposed in a path of the projection beam, wherein the first pair of spatial filtering structures are disposed at a predetermined distance from each other along a direction and the second pair of spatial filtering structures are disposed at a predetermined distance from each other in the same direction, and
wherein the second pair of spatial filtering structures are arranged to move with respect to the first pair of spatial filtering structures so as to cause the projection beam to scan in the same direction.

2. The lithographic apparatus of claim 1, wherein the first and second spatial filtering structures comprise blades.

3. The lithographic apparatus of claim 2, wherein the blades are moveable.

4. The lithographic apparatus of claim 3, wherein the movable blades are arranged to move together and further apart along the Y-direction.

5. The lithographic apparatus of claim 4, wherein the blades of the first pair of spatial filtering structures arranged to move together and apart in the Y-direction are coupled to the support structure.

6. The lithographic apparatus of claim 4, wherein the blades of the first pair of spatial filtering structures arranged to move together and further apart along the Y-direction are coupled to, and additionally each arranged to move in the Y-direction relative to, a frame of the lithographic projection apparatus.

7. The lithographic apparatus of claim 1, wherein the predetermined distance between the first pair of spatial filtering structures defines a scanning length.

8. The lithographic apparatus of claim 1, wherein the predetermined distance between the second pair of spatial filtering structures defines a scanning slit width.

9. The lithographic apparatus of claim 1, wherein the second pair of spatial filtering structures are disposed downstream of the first pair of spatial filtering structures in a direction of projection of the beam of radiation.

10. The lithographic apparatus of claim 1, wherein the illumination system causes the beam of radiation to be focused at a predetermined focal plane and the first and second pair of spatial filtering structures are disposed in a region of the focal plane.

11. The lithographic apparatus of claim 1, wherein the first and second pair of spatial filtering structures are disposed proximate to the support structure.

12. The lithographic apparatus of claim 11, wherein the first pair of spatial filtering structures is disposed between the illumination system and the support structure.

13. The lithographic apparatus of claim 11, wherein the first pair of spatial filtering structures is disposed between the support structure and the projection system.

14. The lithographic apparatus of claim 1, wherein the distance between the first and second pair of spatial filtering structures, respectively, and the relative movement between the first and second spatial filtering structures allow a predetermined scanning profile to be performed.

15. The lithographic apparatus of claim 1, wherein said beam of radiation comprises EUV radiation having a wavelength less than approximately 50 nm.

16. The lithographic apparatus of claim 1, wherein said beam of radiation comprises EUV radiation having a wavelength from approximately 8 nm to approximately 16 nm.

17. A device manufacturing method, comprising:
  providing a substrate that is at least partially covered by a layer of radiation-sensitive material;
  conditioning a beam of radiation using an illumination system;
  providing a support configured to support a patterning device;
  configuring the beam of radiation with a desired pattern in its cross-section based on the patterning device;
  projecting the patterned beam of radiation onto a target area of the layer of radiation-sensitive material; and
  selectively obstructing a portion of the patterned beam via a spatial filter, said selectively obstructing a portion of the patterned beam including:
    employing a first and a second pair of spatial filtering structures disposed in a path of the patterned beam of radiation;
    positioning the first pair of spatial filtering structures at a predetermined distance from each other in a direction;
    positioning the second pair of spatial filtering structures at a predetermined distance from each other in the same direction, and
    moving the second pair of spatial filtering structures with respect to the first pair of spatial filtering structures in order to cause the patterned beam to scan along the same direction.

* * * * *